United States Patent
Pierce et al.

(10) Patent No.: US 7,042,336 B2
(45) Date of Patent: May 9, 2006

(54) METHODS FOR FIELD PROGRAMMING RADIO FREQUENCY IDENTIFICATION DEVICES THAT CONTROL REMOTE CONTROL DEVICES

(75) Inventors: Jeffrey D. Pierce, Sandy Hook, CT (US); Brian M. Romansky, Monroe, CT (US); Thomas J. Foth, Trumbull, CT (US); Anand V. Chhatpar, Madison, WI (US)

(73) Assignee: Pitney Bowes Inc., Stamford, CT (US)

( * ) Notice: Subject to any disclaimer, the term of this patent is extended or adjusted under 35 U.S.C. 154(b) by 405 days.

(21) Appl. No.: 10/430,911

(22) Filed: May 7, 2003

(65) Prior Publication Data

US 2004/0075534 A1    Apr. 22, 2004

Related U.S. Application Data

(60) Provisional application No. 60/419,361, filed on Oct. 18, 2002.

(51) Int. Cl.
| | |
|---|---|
| *H04Q 5/22* | (2006.01) |
| *H04Q 9/00* | (2006.01) |
| *G08B 13/14* | (2006.01) |
| *H03M 11/00* | (2006.01) |
| *G06K 7/10* | (2006.01) |

(52) U.S. Cl. .................. 340/10.5; 340/10.6; 340/5.26; 340/572.1; 341/20; 341/34; 235/462.15; 235/383

(58) Field of Classification Search ............... 340/10.5, 340/10.6, 5.26, 572.1, 572.8, 572.9; 341/20, 341/34; 235/462.15, 462.16, 383, 385
See application file for complete search history.

(56) References Cited

U.S. PATENT DOCUMENTS

| | | | |
|---|---|---|---|
| 4,087,679 A | 5/1978 | Samreus nee | |
| 4,889,961 A | 12/1989 | Carlson | |
| 5,962,834 A | 10/1999 | Markman | |
| 6,003,770 A | 12/1999 | Schilling | |
| 6,018,299 A | 1/2000 | Eberhardt | |
| 6,104,311 A | 8/2000 | Lastinger | |
| 6,111,506 A | 8/2000 | Yap et al. | |
| 6,300,872 B1 * | 10/2001 | Mathias et al. | ............. 340/540 |
| 6,339,385 B1 * | 1/2002 | Tuttle | .................... 340/825.71 |
| 6,436,516 B1 | 8/2002 | Nagashima et al. | |
| 6,480,100 B1 | 11/2002 | Frieden et al. | |
| 6,531,964 B1 * | 3/2003 | Loving | .................. 340/825.72 |
| 6,557,768 B1 | 5/2003 | Yap et al. | |
| 6,628,199 B1 | 9/2003 | Ehrensvärd et al. | |
| 6,695,208 B1 * | 2/2004 | Chew et al. | ................ 235/385 |
| 6,724,311 B1 | 4/2004 | Kolton et al. | |

(Continued)

FOREIGN PATENT DOCUMENTS

DE    19947180 A1    4/2001

(Continued)

*Primary Examiner*—Michael Horabik
*Assistant Examiner*—Scott Au
(74) *Attorney, Agent, or Firm*—Ronald Reichman; Angelo N. Chaclas

(57) ABSTRACT

A remote control device that is combined with a modified RFID circuit that allows an individual to enter information into different types of equipment. When an individual touches graphite contacts on the modified RFID circuit with his/her finger, the circuit will activate a RFID reader causing an action on another device.

3 Claims, 6 Drawing Sheets

U.S. PATENT DOCUMENTS

| | | |
|---|---|---|
| 6,893,489 B1 | 5/2005 | Lem et al. |
| 2001/0006194 A1 | 7/2001 | Kayanakis et al. |
| 2003/0205615 A1 | 11/2003 | Marappan |
| 6,809,628 B1 | 10/2004 | Bensimon et al. |
| 6,825,754 B1 | 11/2004 | Rolin |
| 6,886,750 B1 * | 5/2005 | Rathus et al. .......... 235/462.15 |

FOREIGN PATENT DOCUMENTS

| | | |
|---|---|---|
| DE | 20106542 U1 | 7/2001 |
| DE | 10016716 A1 | 8/2001 |
| JP | 02003037522 A | 2/2003 |
| WO | WO 01/91045 A1 | 11/2001 |

* cited by examiner

METHODS FOR FIELD PROGRAMMING RADIO FREQUENCY IDENTIFICATION DEVICES THAT CONTROL REMOTE CONTROL DEVICES

This application claims the benefit of the filing date of U.S. Provisional Application No. 60/419,361 filed Oct. 18, 2002, which is owned by the assignee of the present application.

CROSS REFERENCE TO RELATED APPLICATIONS

Reference is made to commonly assigned co-pending patent applications Ser. No. 10/431,066 filed herewith entitled "METHOD FOR FIELD PROGRAMMABLE RADIO FREQUENCY DOCUMENT IDENTIFICATION DEVICES" in the names of Anand V. Chhatpar, Jeffrey D. Pierce, Brian M. Romansky, Thomas J. Foth, and Andrei Obrea; Ser. No. 10/430,925 filed herewith entitled "METHOD FOR FIELD PROGRAMMABLE RADIO FREQUENCY IDENTIFICATION TESTING DEVICES FOR TRANSMITTING USER SELECTED DATA" in the names of Thomas J. Foth, Brian M. Romansky, Jeffrey D. Pierce, Andrei Obrea, and Anand V. Chhatpar; Ser. No. 10/430,922 filed herewith entitled "METHOD FOR FIELD PROGRAMMABLE RADIO FREQUENCY IDENTIFICATION DEVICES TO PERFORM SWITCHING FUNCTIONS" in the names of Andrei Obrea, Brian M. Romansky, Thomas J. Foth, Jeffrey D. Pierce, and Anand V. Chhatpar; Ser. No. 10/430,926 filed herewith entitled "METHOD FOR FIELD PROGRAMMING RADIO FREQUENCY IDENTIFICATION LABELS" in the names of Thomas J. Foth, Brian M. Romansky, Jeffrey D. Pierce, and Anand V. Chhatpar; Ser. No. 10/431,067 filed herewith entitled "METHOD FOR FIELD PROGRAMMING RADIO FREQUENCY IDENTIFICATION RETURN FORMS" in the names of Jeffrey D. Pierce, Thomas J. Foth, Brian M. Romansky, Andrei Obrea, and Anand V. Chhatpar; and Ser. No. 10/430,597 filed herewith entitled "METHOD AND APPARATUS FOR FIELD PROGRAMMING RADIO FREQUENCY IDENTIFICATION DEVICES" in the names of Brian M. Romansky, Thomas J. Foth, Jeffrey D. Pierce, Andrei Obrea, and Anand V. Chhatpar.

FIELD OF THE INVENTION

This invention pertains to electronic circuits and, more particularly, to programmable radio frequency identification devices that are used to control remote control devices.

BACKGROUND OF THE INVENTION

Remote control devices have been developed to operate equipment, apparatuses and processes from a distance. The devices may be a remote control for a television set or a control panel for an electric power generating facility. Solid wire, radio frequency, infrared, audio and microwave communications are commonly used to carry control signals between the device and the equipment being controlled. The above devices are expensive. The above devices are also difficult to use in that the controls that form the user interface of the device are not configured in a manner that is optimal for the user.

SUMMARY OF THE INVENTION

This invention overcomes the difficulties of the prior art by creating a user interface by using a pencil or conductive ink on a material equipped with a RFID type circuit, and having control information sent by the RFID circuit, to perform some function, i.e., act as a remote control device. The material may be any cellulose type product, i.e., paper, cardboard, chipboard, wood or plastic, fabric, animal hide, etc. The user interface may be drawn with a standard ink jet computer printer or laser printer to print lines on paper equipped with a RFID type circuit, by having the printed lines perform the function of wires.

This invention accomplishes the foregoing by using the RFID serial number generation portion of the RFID circuit that is used when the RFID circuit is being read. In the prior art, the bits used to encode one's and zero's into the generation portion of the RFID circuit were typically fixed. This invention utilizes the serial number generation portion of the RFID circuit by exposing on a piece of paper all of the bits left open to represent a binary zero. A user may complete the RFID serial number storage portion of the RFID circuit by placing their finger on the connections to create binary ones.

An additional advantage of this invention is that this invention provides a remote control device that is combined with a modified RFID circuit that makes it easy to enter information into different types of equipment. When an individual touches contacts on the modified RFID circuit with his/her finger, the circuit will signal a RFID reader causing an action on another device.

DETAILED DESCRIPTION OF THE PREFERRED EMBODIMENT

Figure 1:
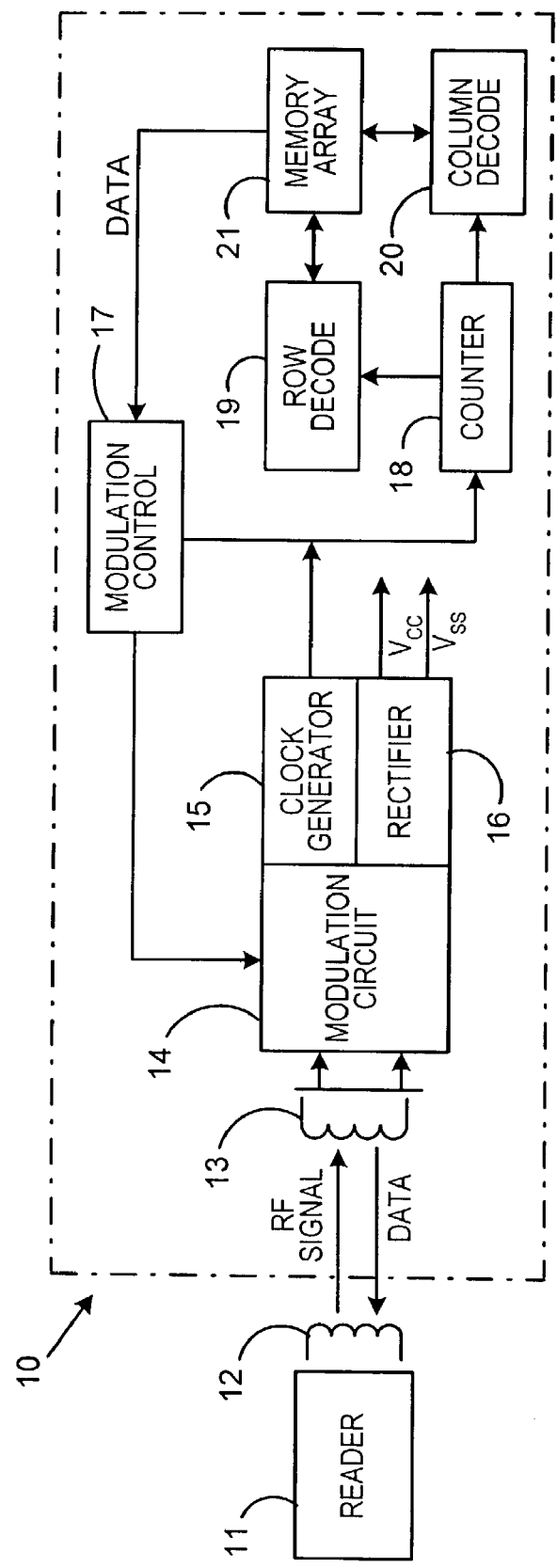
FIG. 1 is a block diagram of a prior art RFID circuit.

Referring now to the drawings in detail, and more particularly to FIG. 1, the reference character 10 represents a prior art RFID circuit. Circuit 10 may be the model MCRF 200 manufactured by Microchip Technology, Inc. of 2355 West Chandler Blvd, Chandler, Ariz. 85224. RFID reader 11 is connected to coil 12, and 12 is coupled to coil 13. Coil 13 is connected to modulation circuit 14. Modulation circuit 14 is connected to clock generator 15 and rectifier 16. Modulation control 17 is coupled to modulation circuit 14, clock generator 15 and counter 18. Counter 18 is coupled to column decode 20. Row decode 19 is coupled to memory array 21, and array 21 is coupled to modulation control 17.

It would be obvious to one skilled in the art that a battery may be used to supply power to circuit 10.

Reader 11 has a transmitter mode and a receiver mode. During the transmit mode of reader 11, reader 11 transmits a radio frequency signal for a burst of time via coil 12. After the transmission of a signal by reader 11, reader 11 turns into a receiver. Coil 12 is inductively linked with coil 13, and coil 13 receives the radio frequency signal from coil 12 and converts the aforementioned signal into inductive energy, i.e., electricity. When coil 13 has sufficient energy, coil 13 will cause clock generator 15 to generate timing pulses which drive counter 18. Counter 18 drives row decode 19 which causes memory array 21 to read the fixed bit data pattern stored in memory array 21 one bit at a time. As the data bits are being read by array 21, the data bits are transmitted to modulation control circuit 17. Control circuit 17 sends the data bits to reader 11 via modulation circuit 14 and coils 13 and 12.

Figure 2A:
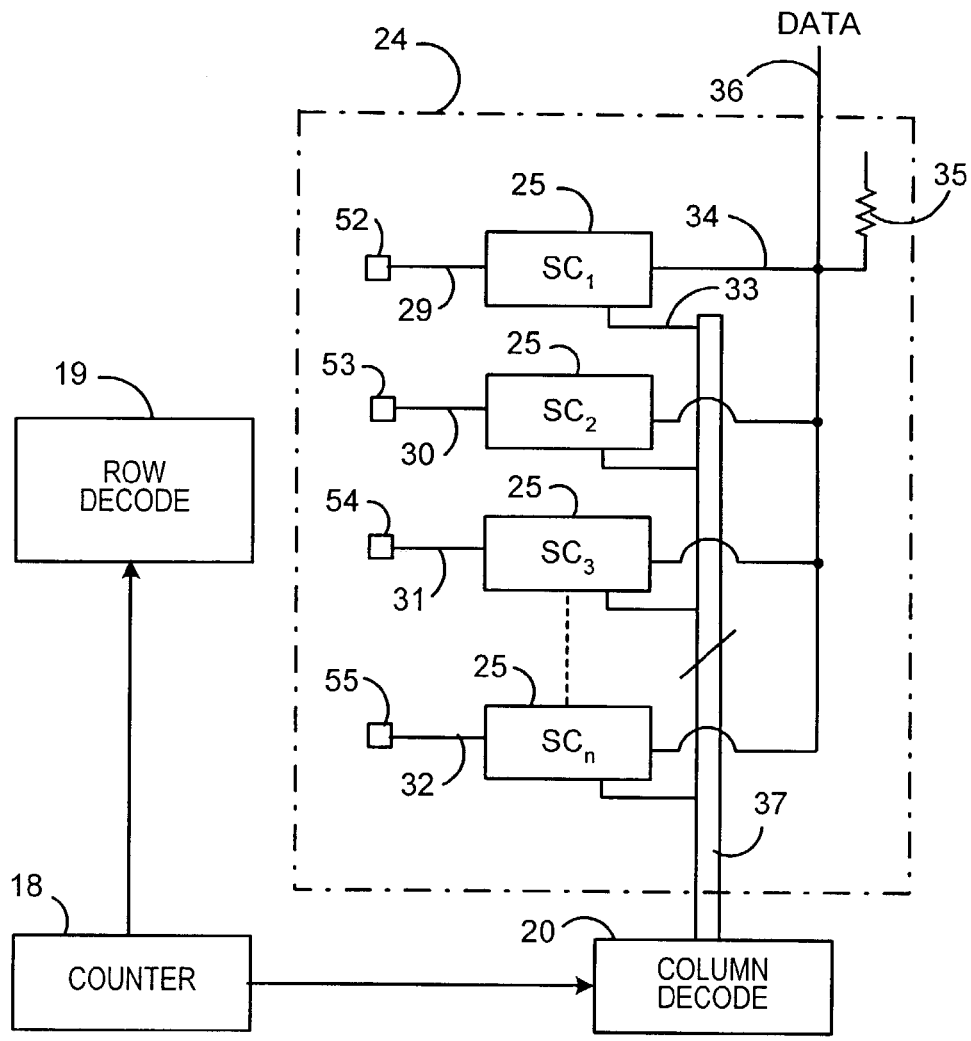
FIG. 2A is a drawing of a circuit 24 that replaces memory array 21 of FIG. 1 showing how programming of the bits may be accomplished by making the bits externally available for programming RFID circuit 10.

FIG. 2A is a drawing of a circuit 24 that replaces memory array 21 of FIG. 1 showing how programming of the bits may be accomplished by making the bits externally available for programming RFID circuit 10. A plurality of sensor circuits 25 is contained in circuit 24. Sensor circuits 25 are labeled $SC_1$ $SC_2$ $SC_3$ ... $SC_n$. Line 29 is connected to $SC_1$ and graphite contact 52 and line 30 is connected to $SC_2$ and graphite contact 53. Line 31 is connected to $SC_3$ and graphite contact 54 and line 32 are connected to $SC_n$ and graphite contact 55. There is a sensor circuit 25 for each graphite contact. The description of FIG. 4 will describe how information may be entered into circuit 24 via graphite contacts 52–55. $SC_1$ has an input 33, which enables the data output 34. Input 33 is connected to one of the n lines 37, and data output 34 is connected to data line 36 and pull up resistor 35. Data line 36 is connected to modulation control 17 (FIG. 1).

When counter 18 selects the value 1, column decode 20 will enable line 33, which will cause the same logic level that is on graphite contact 52 to be placed on data output 34. When line 33 is not selected, the value on graphite contact 52 does not have any influence on the data output line 34. Enable outputs 33 for $SC_1$ ... $SC_n$ are bundled together in lines 37 so that only one line 37 is turned on at a time. Lines 37 are connected to column decode 20. Column decode 20 is connected to counter 18, and counter 18 is connected to row decode 19. Counter 18 generates a sequence of numbers from 1 through n to enable a different line 37 in sequential order. Thus, data line 36 will receive the data outputs 34 from $SC_1$ ... $SC_n$ at different times.

Figure 2B:
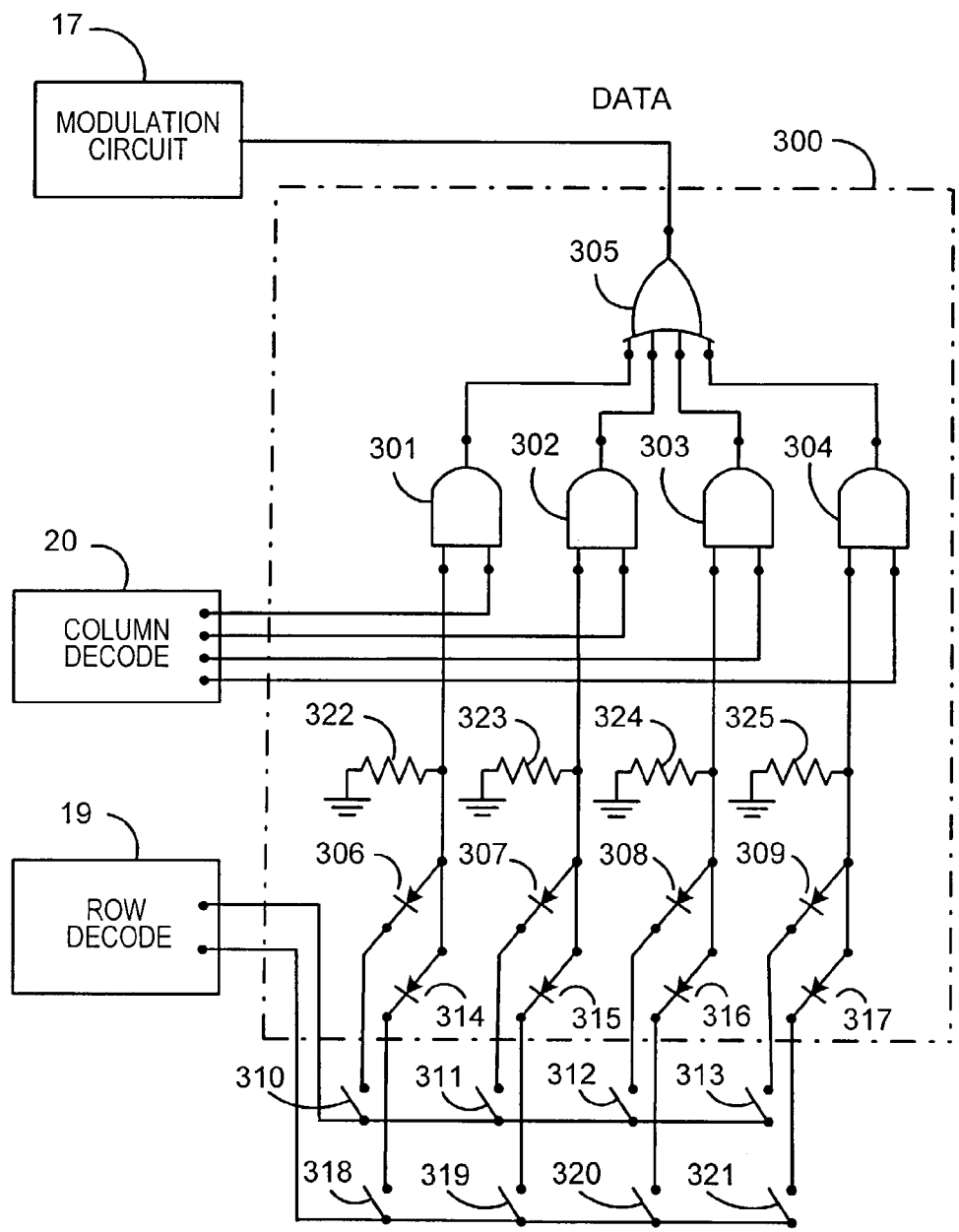
FIG. 2B is a drawing of a circuit 300 that is an alternate representation of circuit 24, that replaces memory array 21 of FIG. 1 showing how programming of the bits may be accomplished by making the bits externally available for programming RFID circuit 10.

FIG. 2B is a drawing of a circuit 300 that is an alternate representation of circuit 24, that replaces memory array 21 of FIG. 1 showing how programming of the bits may be accomplished by making the bits externally available for programming RFID circuit 10. Circuit 300 includes AND gates 301, 302, 303 and 304 and OR gate 305.

One of the inputs of AND gate 301 is connected to column decode 20 and the other input to AND gate 301 is connected to one of the ends of resistor 322, one of the ends of diode 306 and one of the ends of diode 314. The other end of resistor 322 is connected to ground. The other end of diode 306 is connected to one of the terminals of toggle switch 310, and the other end of toggle switch 310 is connected to row decode 19. The other end of diode 314 is connected to one of the terminals of toggle switch 318, and the other end of toggle switch 318 is connected to row decode 19.

One of the inputs of AND gate 302 is connected to column decode 20, and the other input to AND gate 302 is connected to one of the ends of resistor 323, one of the ends of diode 307 and one of the ends of diode 315. The other end of resistor 323 is connected to ground. The other end of diode 307 is connected to one of the terminals of toggle switch 311, and the other end of toggle switch 311 is connected to row decode 19. The other end of diode 315 is connected to one of the terminals of toggle switch 319, and the other end of toggle switch 319 is connected to row decode 19.

One of the inputs of AND gate 303 is connected to column decode 20, and the other input to AND gate 303 is connected to one of the ends of resistor 324, one of the ends of diode 308 and one of the ends of diode 316. The other end of resistor 324 is connected to ground. The other end of diode 308 is connected to one of the terminals of toggle switch 312, and the other end of toggle switch 312 is connected to row decode 19. The other end of diode 316 is connected to one of the terminals of toggle switch 320, and the other end of toggle switch 320 is connected to row decode 19.

One of the inputs of AND gate 304 is connected to column decode 20, and the other input to AND gate 304 is connected to one of the ends of resistor 325, one of the ends of diode 309 and one of the ends of diode 317. The other end of resistor 325 is connected to ground. The other end of diode 309 is connected to one of the terminals of toggle switch 313, and the other end of toggle switch 312 is connected to row decode 19. The other end of diode 317 is connected to one of the terminals of toggle switch 321, and the other end of toggle switch 321 is connected to row decode 19.

Column decode 20 and row decode 19 function by taking the selected output at logic one, i.e., a high level and keeping all the other outputs at logic zero, i.e., a low level. The output of AND gates 301–304 are connected to the input of OR gate 305, and the output of OR gate 305 is data that is connected to the input of modulation circuit 17. If switches 310, 311, 312 and 313, respectively, remain open, AND gates 301–304, respectively, will have a "zero" output. If switches 310, 311, 312 and 313, respectively, are closed, AND gates 301–304, respectively, will have a "one" output. The output of AND gates 301–304, respectively, will be read when switches 318–321, respectively, are closed.

Figure 3:
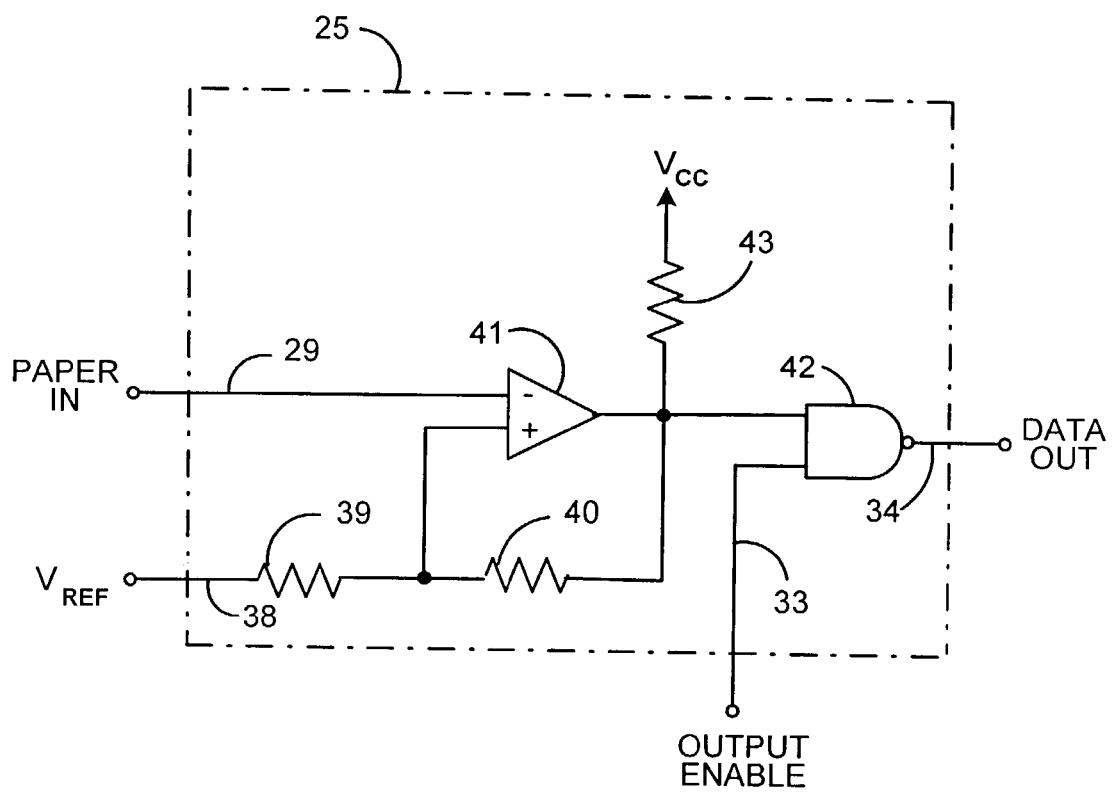
FIG. 3 is a drawing showing sensor circuit 25 of FIG. 2A in greater detail.

FIG. 3 is a drawing showing sensor circuit 25 of FIG. 2A in greater detail. The negative input of comparator 41 is connected to line 29, and the positive input of comparator 41 is connected to line 38. Comparator 41 may be a LM339N comparator. One end of line 38 is connected to a 2–3 volt reference voltage, and the other end of line 38 is connected to one of the ends of resistor 39. The other end of resistor 39 is connected to the positive input of comparator 41 and one of the ends of resistor 40. The other end of resistor 40 is connected to the input of NAND gate 42, the output of comparator 41 and one of the ends of resistor 43. The other end of resistor 43 is connected to a source voltage to act as a pull up resistor. The other input to NAND gate 42 is enable output 33. The output of gate 42 is data output 34. Resistor 39 may be 47,000 ohms, and resistor 40 may be 470,000 ohms. Resistor 43 may be 1,000 ohms. Comparator 41 has a positive feedback to provide a small amount of hysteresis Sensor circuit 25 is a differential circuit that accommodates variations in the conductivity of the conductive material. The conductive material may be used as a voltage divider to produce $V_{ref}$ on line 38 under the same conditions experienced by $paper_{in}$ on line 29. Thereby, nullifying the effects of varying resistance in the conductive material. It will be obvious to one skilled in the art that sensor circuit 25 may replace switches 310–313 and 318–321 of FIG. 2B.

Figure 4:
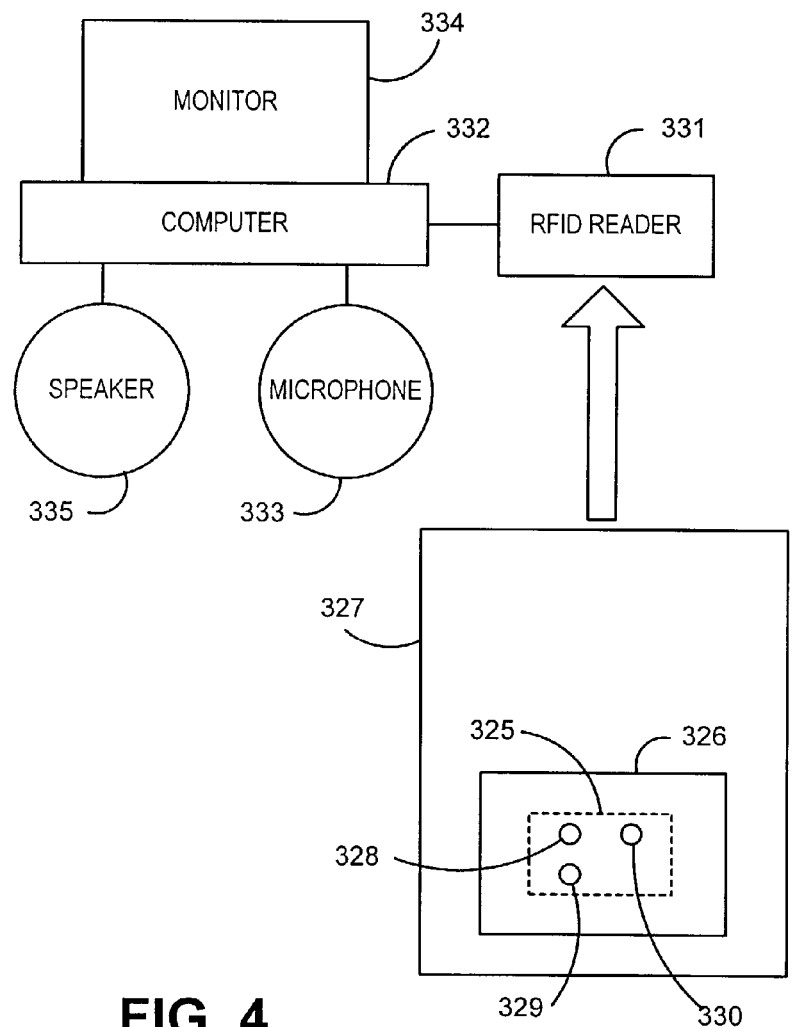
FIG. 4 is a drawing showing how a modified RFID circuit attached to a label may be used as a remote control device.

FIG. 4 is a drawing showing how a modified RFID circuit attached to a label may be used as a remote control device. Circuit 325 is attached to a label or Post-it® 326 containing an adhesive. Label 326 is adhered to a document 327 that contains information. Circuit 325 will be more fully described in the description of FIG. 5. Circuit 325 includes graphite contacts 328, 329 and 330. A number will be stored in circuit 325 (FIG. 5) at the time of the circuit's manufacture.

Document 327 will be associated with label 326. When an individual touches record graphite contact 328 with his/her finger, circuit 325 will cause modified circuit 10 (FIG. 1) to signal RFID reader 331 causing computer 332 to turn on microphone 333. The person touching contact 328 may speak, and microphone 333 will send the spoken message to computer 332. Computer 332 will associate the message with the number stored in circuit 325. Computer 332 may display the spoken message on monitor 334. The person touching contact 328 may remove his/her finger from contact 328 and touch play graphite contact 330. RFID reader will cause computer 332 to have the previously spoken message transmitted via speaker 335. If the person touching contact 330 wants to keep the transmitted message, he/she will stop touching contact 330 with his/her finger and touch save contact 339 with his/her finger. RFID reader will cause computer 332 to save the previously spoken message and associate the message with the number stored in circuit 325.

Figure 5:
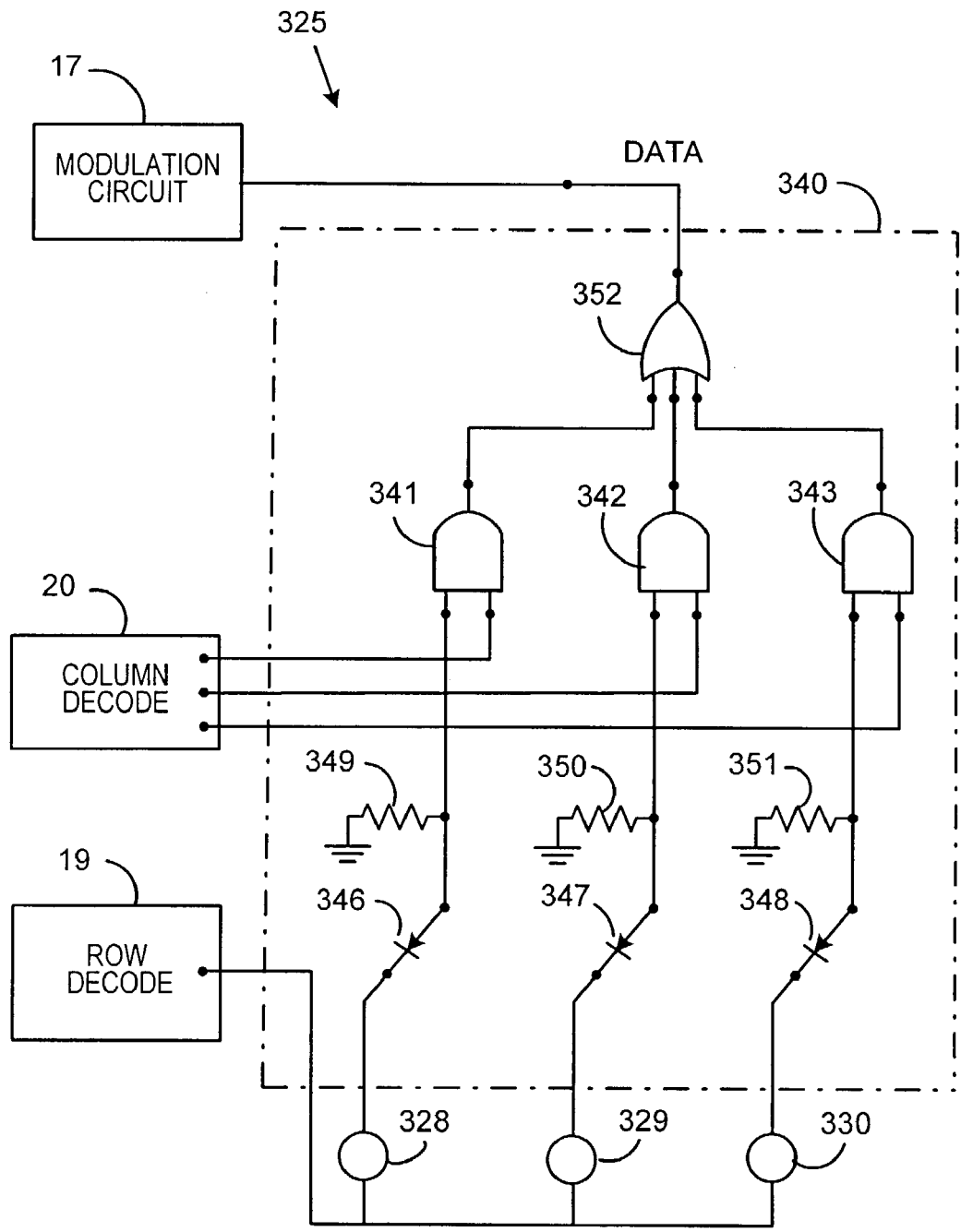
FIG. 5 is a drawing showing circuit 325 of FIG. 4 in greater detail.

FIG. 5 is a drawing showing circuit 325 of FIG. 4 in greater detail. Circuit 325 is essentially the same circuit shown as circuit 10 of FIG. 1 with circuit 340 replacing memory array 21 of FIG. 1. One of the inputs of AND gate 341 is connected to column decode 20, and the other input to AND gate 341 is connected to one of the ends of resistor 349 and one of the ends of diode 346. The other end of diode 346 is connected to one of the ends of graphite contact 328. The other end of resistor 349 is connected to ground. The other end of contact 328 is connected to row decode 19.

One of the inputs of AND gate 342 is connected to column decode 20, and the other input to AND gate 342 is connected to one of the ends of resistor 350 and one of the ends of diode 347. The other end of diode 347 is connected to one of the ends of graphite contact 329. The other end of resistor 350 is connected to ground. The other end of contact 329 is connected to row decode 19.

One of the inputs of AND gate 343 is connected to column decode 20, and the other input to AND gate 343 is connected to one of the ends of resistor 351 and one of the ends of diode 348. The other end of diode 348 is connected to one of the ends of graphite contact 330. The other end of resistor 351 is connected to ground. The other end of contact 330 is connected to row decode 19.

The output of AND gates 341, 342 and 343 is connected to the input of OR gate 352, and the output of OR gate 352 is data that is connected to the input of modulation circuit 17.

If contacts 328, 329 and 330 are not touched, they will remain open, AND gates 341–343, respectively, will have a "zero" output. If contacts 328, 329 and 330 are touched, they will be closed, respectively, and when column decode 20 provides a "one" output to one of AND gates 341, 342 and 343, that AND gate that received an input from column decode 20 and was touched will have a "one" output. AND gates 341, 342 and 343, supply their outputs to the inputs of OR gate 352 which provides its output to the input of modulation circuit 17. This causes modulation circuit 17 to transmit a "one" or a "zero" out of RFID circuit 10 in accordance with the output of AND gates 341, 342 and 343.

It would be obvious to one skilled in the art that the output of circuit 340 may be combined with the output of a read only memory device in which a unique number is stored. Thus, when RFID circuit 10 is read the unique number is read along with the status of contacts 328, 329 and 330.

The above specification describes a new and improved circuit and RFID type circuit that is used to control remote control devices. It is realized that the above description may indicate to those skilled in the art additional ways in which the principles of this invention may be used without departing from the spirit. Therefore, it is intended that this invention be limited only by the scope of the appended claims.

What is claimed is:

1. A method for signaling information by a radio frequency identification (RFID) circuit having a unique number generation portion that is activated when the RFID circuit is read by control equipment, said method comprising the steps of:
   a) exposing on a material data bits of the number generation portion of the RFID circuit in a manner that the data bits will represent binary ones or zeros;
   b) altering on a material the data bits of the number generation portion of the RFID circuit in a manner that the data bits will represent binary ones or zeros; wherein the RFID circuit has a unique number generation portion that when combined with the number generation portion of the RFID circuit indicates to the control equipment which remote control device is being touched;
   c) touching contacts on the material so that the RFID circuit will perform some function; and
   d) coupling the RFID circuit to equipment to remotely control the equipment.

2. The method claimed in claim 1, wherein the equipment is a tape recorder.

3. The method claimed in claim 1, wherein the equipment is a computer.

* * * * *